(12) United States Patent
Shieh et al.

(10) Patent No.: US 9,379,247 B2
(45) Date of Patent: Jun. 28, 2016

(54) HIGH MOBILITY STABILE METAL OXIDE TFT

(75) Inventors: Chan-Long Shieh, Paradise Valley, AZ (US); Gang Yu, Santa Barbara, CA (US); Fatt Foong, Goleta, CA (US); Tian Xiao, Goleta, CA (US); Juergen Musolf, Santa Barbara, CA (US)

(73) Assignee: CBRITE INC., Goleta, CA (US)

( * ) Notice: Subject to any disclaimer, the term of this patent is extended or adjusted under 35 U.S.C. 154(b) by 80 days.

(21) Appl. No.: 13/536,641

(22) Filed: Jun. 28, 2012

(65) Prior Publication Data

US 2014/0001462 A1    Jan. 2, 2014

(51) Int. Cl.
*H01L 29/10* (2006.01)
*H01L 29/786* (2006.01)

(52) U.S. Cl.
CPC .................... *H01L 29/7869* (2013.01)

(58) Field of Classification Search
CPC .............. H01L 29/786; H01L 29/7869; H01L 29/78696
USPC ............................. 257/43, E29.143, E29.151
See application file for complete search history.

(56) References Cited

U.S. PATENT DOCUMENTS

| 6,043,113 | A  * | 3/2000  | Farrell ................... H01L 21/383 257/E21.441 |
| 7,923,722 | B2 * | 4/2011  | Ryu et al. .......................... 257/43 |
| 8,143,115 | B2 * | 3/2012  | Omura et al. ................... 438/158 |
| 8,163,592 | B2 * | 4/2012  | Kirita .................. H01L 29/7869 438/85 |
| 8,330,155 | B2 * | 12/2012 | Jeon ..................... H01L 29/7869 257/152 |
| 8,361,897 | B2 * | 1/2013  | Pieralisi ......................... 438/609 |
| 2005/0017302 | A1 * | 1/2005  | Hoffman ............... H01L 29/105 257/347 |
| 2011/0057185 | A1 * | 3/2011  | Peng .................... H01L 29/4908 257/43 |
| 2011/0284836 | A1 * | 11/2011 | Lee .......................... H01L 29/45 257/43 |
| 2012/0056173 | A1 * | 3/2012  | Pieralisi ............ H01L 23/53238 257/43 |
| 2012/0104384 | A1 * | 5/2012  | Choi et al. ....................... 257/43 |
| 2012/0327032 | A1 * | 12/2012 | Jeon .................. H01L 27/14609 345/175 |
| 2013/0221360 | A1 * | 8/2013  | Tsang .............................. 257/66 |

OTHER PUBLICATIONS

Cho et al., "Transparent Oxide Thin-Film Transistors Composed of Al and Sn-doped Zinc Indium Oxide", IEEE Electron Device Letters 30 (2009) pp. 48-50.*

* cited by examiner

*Primary Examiner* — Jay C Kim
(74) *Attorney, Agent, or Firm* — Robert A. Parsons; Michael W. Goltry; Parsons & Goltry

(57) ABSTRACT

A method of fabricating a stable, high mobility metal oxide thin film transistor includes the steps of providing a substrate, positioning a gate on the substrate, and depositing a gate dielectric layer on the gate and portions of the substrate not covered by the gate. A multiple film active layer including a metal oxide semiconductor film and a metal oxide passivation film is deposited on the gate dielectric with the passivation film positioned in overlying relationship to the semiconductor film. An etch-stop layer is positioned on a surface of the passivation film and defines a channel area in the active layer. A portion of the multiple film active layer on opposite sides of the etch-stop layer is modified to form an ohmic contact and metal source/drain contacts are positioned on the modified portion of the multiple film active layer.

6 Claims, 6 Drawing Sheets

BOTTOM GATE TOP S/D TFT
DUAL CHANNEL WITH SELECTIVELY MODIFIED PASSIVATION METAL OXIDE FOR CONTACT ary image sensor arrays. The major advantage of the MOTFT is the ability to achieve high mobility in the amorphous/nanocrystalline phase. The amorphous/nanocrystalline phase insures short range uniformity similar to that observed in a-Si TFT. However, the key challenge for MOTFTs is the operation stability at high temperature or under high biasing fields. High mobility metal oxide such as $In_2O_3$ and InZnO tends to be unstable under negative field bias at high temperatures. To improve the negative bias stability, more stable elements such as Ga have been added into the metal oxide (e.g. InGaZnO) which tends to sacrifice mobility considerably. Thus, in the prior art the tradeoff is between operational stability and mobility.

HIGH MOBILITY STABILE METAL OXIDE TFT

FIELD OF THE INVENTION

This invention generally relates to operationally stable, high mobility thin film transistors (TFTs).

BACKGROUND OF THE INVENTION

The metal oxide thin film transistor (MOTFT) has shown great promise for large area electronic applications such as displays and digital image sensor arrays. The major advantage of the MOTFT is the ability to achieve high mobility in the amorphous/nanocrystalline phase. The amorphous/nanocrystalline phase insures short range uniformity similar to that observed in a-Si TFT. However, the key challenge for MOTFTs is the operation stability at high temperature or under high biasing fields. High mobility metal oxide such as $In_2O_3$ and InZnO tends to be unstable under negative field bias at high temperatures. To improve the negative bias stability, more stable elements such as Ga have been added into the metal oxide (e.g. InGaZnO) which tends to sacrifice mobility considerably. Thus, in the prior art the tradeoff is between operational stability and mobility.

It would be highly advantageous, therefore, to remedy the foregoing and other deficiencies inherent in the prior art.

Accordingly, it is an object of the present invention to provide a new and improved MOTFT with improved operational stability and high mobility.

It is another object of the present invention to provide new and improved methods of fabricating MOTFTs with improved operational stability and high mobility.

It is another object of the present invention to provide new and improved methods and apparatus for reducing the $V_{th}$ shift under negative and positive bias temperature stress in a MOTFT.

SUMMARY OF THE INVENTION

The desired objects of the instant invention are achieved in accordance with an embodiment thereof wherein a metal oxide thin film transistor includes a substrate, a gate positioned on an upper surface of the substrate, and a gate dielectric layer positioned on the gate and portions of the substrate not covered by the gate. A multiple film active layer is positioned on the gate dielectric layer. An etch-stop layer covers a portion of the multiple film active layer and defines a channel area in the active layer. Metal source/drain contacts are positioned on the active layer on opposite sides of the etch-stop layer. The multiple films of the active layer include a metal oxide semiconductor film and a metal oxide passivation film. The metal oxide passivation film is positioned between the metal oxide semiconductor film and the etch-stop layer. A portion of the multiple film active layer on opposite sides of the etch-stop layer is modified to increase the conductivity and provide a good ohmic contact and the metal source/drain contacts are positioned on the modified portion of the multiple film active layer The desired objects of the instant invention are achieved in accordance with a specific embodiment thereof wherein the metal oxide thin film transistor includes a multiple film active layer with a contact layer between the metal oxide passivation film and the etch-stop layer and the etch-stop layer includes an oxygen donating material.

The desired objects of the instant invention are achieved in accordance with another specific embodiment thereof wherein the metal oxide thin film transistor includes a thin metal film positioned between the metal oxide semiconductor film and the gate dielectric layer. In this embodiment the thin metal film includes an oxygen bonding metal and has a thickness less than approximately 5 molecular layers thick.

Briefly, the desired objects of the instant invention are further achieved in accordance with a method of fabricating a stable, high mobility metal oxide thin film transistor. The method includes the steps of providing a substrate, positioning a gate on the substrate, and depositing a gate dielectric layer on the gate and portions of the substrate not covered by the gate. A multiple film active layer including a metal oxide semiconductor film and a metal oxide passivation film is deposited on the gate dielectric with the passivation film positioned in overlying relationship to the semiconductor film. An etch-stop layer is positioned on a surface of the passivation film and defines a channel area in the active layer. A portion of the multiple film active layer on opposite sides of the etch-stop layer is modified to form an ohmic contact and metal source/drain contacts are positioned on the modified portion of the multiple film active layer.

The desired objects of the instant invention are also achieved in accordance with a method of fabricating a stable, high mobility metal oxide thin film transistor wherein the metal oxide thin film transistor includes a substrate, a gate positioned on the substrate, a gate dielectric layer positioned on the gate and portions of the substrate not covered by the gate, an active layer positioned on the gate dielectric layer, an etch-stop layer positioned on the active layer so as to define a channel area in the active layer, and metal source/drain contacts positioned on the active layer on opposite sides of the etch-stop layer and the method of fabricating a stable, high mobility active layer includes the steps of forming the active layer with a plurality of films including a metal oxide semiconductor film and a metal oxide passivation film and positioning the metal oxide passivation film between the metal oxide semiconductor film and the etch-stop layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
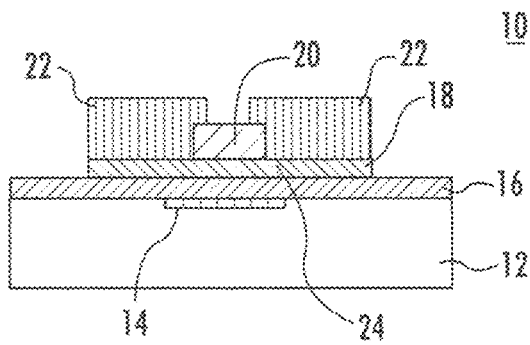
FIG. 1 is a simplified layer diagram of a typical MOTFT with a passivation layer and ohmic source-drain contacts.

Referring specifically to FIG. 1, a simplified layer diagram of a typical MOTFT 10 with a passivation layer and ohmic source-drain contacts is illustrated. In this specific example, MOTFT 10 is a bottom gate and top source/drain metal oxide TFT. It will be understood that the present invention can apply to any of the numerous MOTFTs and MOTFT 10 is simply shown for illustrative purposes only. MOTFT 10 includes a substrate 12 which is typically made of glass or plastic sheet with a proper passivation coating. For certain applications, an additional passivation layer and/or buffer layer may be added on the top surface of substrate 12 and for purposes of this disclosure all of the examples (e.g. passivation layer, buffer layer, etc.) will be included in the term "substrate".

MOTFT 10 includes substrate 12 with gate metal 14 patterned thereon. A gate dielectric layer 16 is deposited over gate metal 14 and a metal oxide semiconductor active layer 18 is deposited over dielectric layer 16 so as to insulate active layer 18 from gate metal 14. A passivation layer 20 is patterned on active layer 18 and source/drain contacts 22 are formed on opposite sides of passivation layer 20 on exposed upper surfaces of active layer 18. The space between the source and drain defines the conduction channel, designated 24, for MOTFT 10. While the bottom gate and top source/drain metal oxide TFT is primarily of interest in the present invention, it is believed that any of the various possible MOTFT configurations could be adapted to the disclosed method including for example a bottom gate, bottom source/drain type of device, a top gate, top source/drain type of device, etc.

Figure 2:
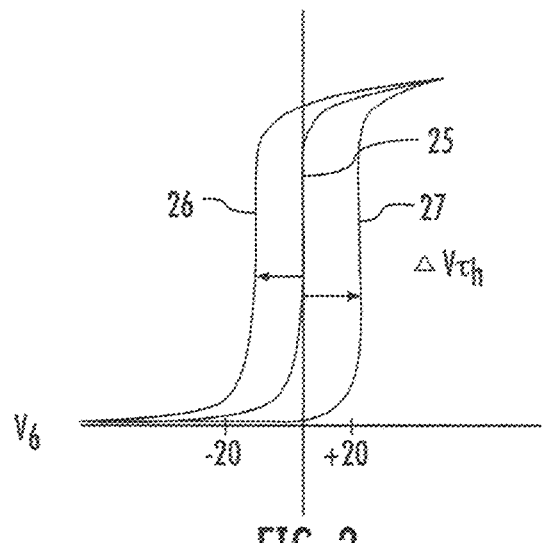
FIG. 2 is a graph illustrating $V_{th}$ shift in the MOTFT of FIG. 1 under negative and positive bias fields.

In MOTFT 10 the top surface of the metal oxide conduction channel 18 is protected by etch-stop layer 20. In U.S. Pat. No. 7,812,346, (incorporated herein by reference) a series of organic and inorganic dielectric films are disclosed for use as such etch-stop layers. The organic etch-stop layers are deposited by solution coating or dispensing and can be patterned easily for example by using a photolithographic patterning process without damaging the underlying film. A problem with organic dielectric films is that they are not as good as inorganic dielectric films in terms of protection against water (humidity) penetration from ambient environment. Water absorption at the surface and penetration through etch-stop layer 20 have been identified to be the source of threshold voltage shift under negative field bias. Note that source/drain contacts 22 are formed of thick metal and provide very good protection against the penetration of moisture. Referring additionally to FIG. 2, a typical $V_{th}$ curve, designated 25, for MOTFET 10 is illustrated. Curve 26 illustrates a shift in the $V_{th}$ curve under for example a negative 20 volt bias field at 60° C. for some period of time, such as an hour.

Inorganic etch-stop layers or films are harder to provide in terms of deposition and patterning, i.e. they must be deposited at relatively high temperatures and because of the deposition techniques that must be used it is difficult to deposit thick enough layers. Both the deposition and patterning of inorganic layers can cause substantial damage to the underlying metal oxide film thereby substantially reducing the mobility. To summarize, the underlying film surface (i.e. metal oxide semiconductor active layer 18) has to be very stable against water and other processing damage. Such a stable film usually has a lower mobility. Thus, in the prior art there is a tradeoff between mobility and negative bias stress stability.

In order to achieve a high mobility MOTFET with good negative bias stress stability at high operation temperatures, a two film channel or active layer is proposed in this invention. In the two film structure, the bottom conduction film is optimized for high mobility and may not be so stable against environmental attack. Examples of such a conduction layer are $In_2O_3$ and InZnO. The top or passivation film is a more stable metal oxide film with lower mobility and lower carrier concentration, such as InAlZnO, AlZnO, etc. In a preferred method of fabrication, the two films of the structure can be deposited in a single sputter machine without breaking the vacuum (i.e. deposited in situ). Operation consistency is thus warranted, as well as simplicity. One challenge to the two film structure is to make a good ohmic contact between the source/drain metal and the top passivation film. To this end three examples are illustrated and explained below.

Figure 3:
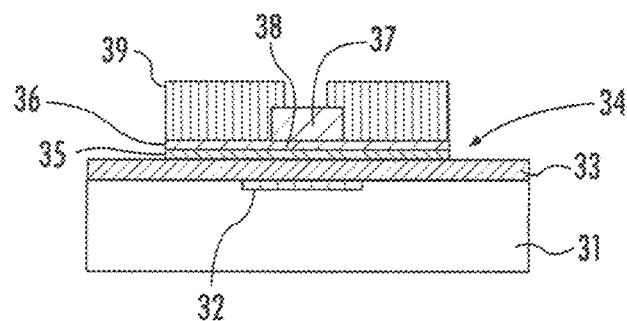
FIG. 3 is a simplified layer diagram of an example of a MOTFT with improved operational stability and high mobility, in accordance with the present invention.

Referring specifically to FIG. 3, a first example is illustrated of a MOTFT 30 with improved operational stability and high mobility, in accordance with the present invention. MOTFET 30 includes a substrate 31 with a bottom gate 32 patterned in the upper surface. A gate dielectric layer 33 is deposited over gate 32 and the upper surface of substrate 31. An active layer 34, which in this example includes an upper passivation film 36 and an underlying conduction film 35, is deposited on the upper surface of gate dielectric layer 33. An etch-stop layer 37 is provided on the upper surface of active layer 34 and defines the channel area 38 in active layer 34. Source/drain metal contacts 39 are deposited on either side of etch-stop layer 37 to complete MOTFT 30.

In the preferred embodiment underlying conduction film 35 includes a high mobility semiconductor metal oxide including high concentrations of indium, such as $In_2O_3$, InZnO, and the like. Underlying conduction film 35 may be for example approximately 200 nm thick. Also, in this specific example upper passivation film 36 is a much more stable and lower mobility metal oxide material. Upper passivation film 35 is very thin and may be for example less than approximately 50 nm thick. Further, upper passivation film 36 is a material that can be selectively modified (at least the upper surface) by exposure to a strong base such as KOH, TMAH (tri methyl ammonia hydroxide) etc.

As a typical example of the two film active layer, any passivation film with a high aluminum content (e.g. InAlZnO) will be attacked selectively by the strong base. The attack by the strong base will remove the aluminum and thereby increase the conductivity and carrier concentration which will enable a good ohmic contact to the modified passivation film. It will be noted that etch-stop layer 37 is generally deposited in a blanket form and patterned to leave the portion illustrated. Also, the material used during patterning of etch-stop layer 37 (generally a strong base) may be sufficient to modify passivation film 36. Since channel area 38 is protected by etch-stop layer 37, passivation film 36 remains unmodified by the strong base and provides protection against environmental attack.

Figure 4:
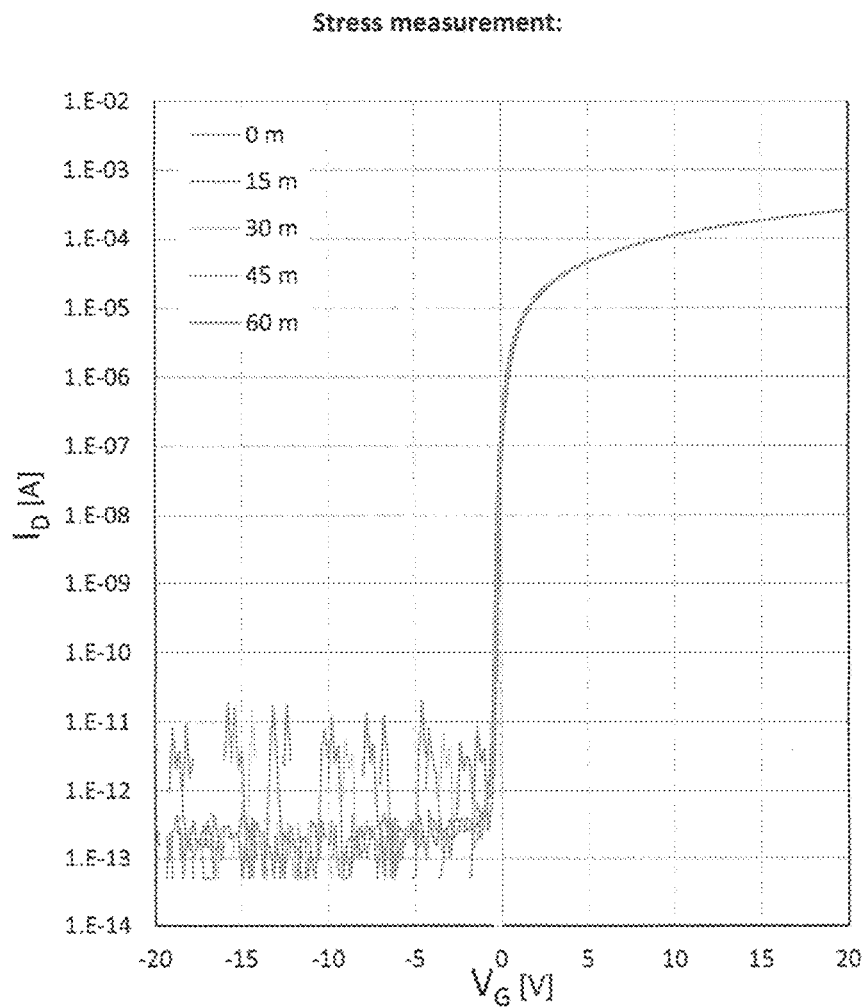
FIG. 4 is a graph illustrating $V_{th}$ stability in the MOTFT of FIG. 3 under negative bias fields.

The major lateral conduction between source and drain is carried by the high mobility underlying conduction film 35. The modified upper passivation layer (in the source/drain contact areas) enables a good ohmic contact and the vertical resistance from the contact metal 39 to underlying conduction film 35 is very small because passivation film 36 is very thin and the ohmic contact is good at the operating current density (typically $<10^3$ Ohms). Thus, a very high mobility ($>20$ cm²/Vs) with a very good negative bias stability at high temperatures can be produced. A metal oxide transistor fabricated in accordance with the above method showed mobility more than 35 cm²/Vs and a negative bias stability illustrated in FIG. 4. In FIG. 4 it can be seen that the $V_{th}$ curve remained stationary with changing bias field between 0 mv/cm and 60 mv/cm and an operating temperature of 60° C. for a period in excess of an hour.

Figure 5:
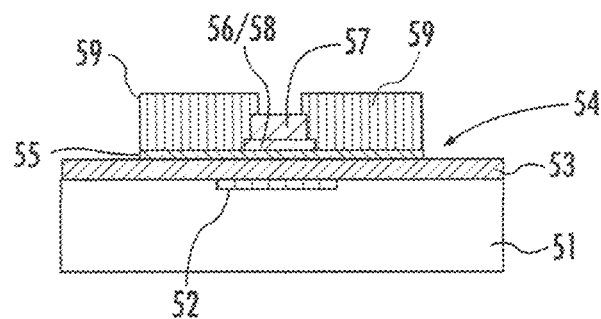
FIG. 5 is a simplified layer diagram of another example of a MOTFT with improved operational stability and high mobility, in accordance with the present invention.

Referring specifically to FIG. 5, a second example is illustrated of a MOTFT 50 with improved operational stability and high mobility, in accordance with the present invention. MOTFET 50 includes a substrate 51 with a bottom gate 52 patterned in the upper surface. A gate dielectric layer 53 is deposited over gate 52 and the upper surface of substrate 51. An active layer 54, which in this example includes a underlying conduction film 55 and an upper passivation film 56, is deposited on the upper surface of gate dielectric layer 53. An etch-stop layer 57 is provided on the upper surface of active layer 54 and defines the channel area 58 in active layer 54. Source/drain metal contacts 59 are deposited on either side of etch-stop layer 57 to complete MOTFT 50.

In the preferred embodiment underlying conduction film 55 includes a high mobility semiconductor metal oxide including high concentrations of indium, such as $In_2O_3$, InZnO, and the like. Underlying conduction film 55 may be for example approximately 200 nm thick. Also, in this specific example upper passivation film 56 is a much more stable and lower mobility metal oxide material. Upper passivation film 55 is very thin and may be for example less than approximately 50 nm thick. Further, upper passivation film 56 is a material that can be selectively modified (at least the upper surface) by exposure to a strong base such as KOH, TMAH (tri methyl ammonia hydroxide) etc. As a typical example the passivation film can be $Al_2O_3$ which will be attacked selectively by the strong base and, in this example, passivation layer 56 is etched away leaving conductive film 55 exposed in the source/drain contact areas. Thus a good ohmic contact can be made to conductive film 55 and passivation film 56 remains intact between etch-stop layer 57 and conductive film 55 so that conductive film is not attacked by ambient moisture.

Figure 6:
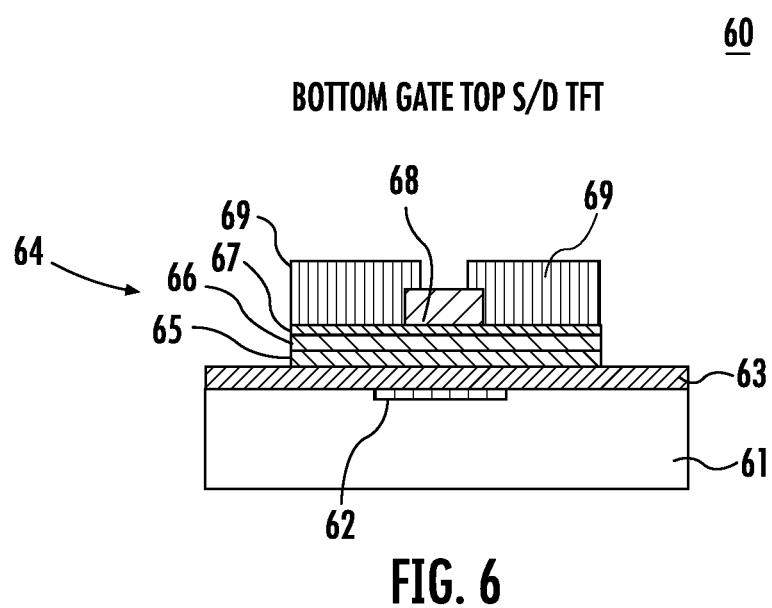
FIG. 6 is a simplified layer diagram of another example of a MOTFT with improved operational stability and high mobility, in accordance with the present invention.

Referring specifically to FIG. 6, a third example is illustrated of a MOTFT 60 with improved operational stability and high mobility, in accordance with the present invention. MOTFET 60 includes a substrate 61 with a bottom gate 62 patterned in the upper surface. A gate dielectric layer 63 is deposited over gate 62 and the upper surface of substrate 61. An active layer 64, which in this example includes a underlying conduction film 65, a middle passivation film 66, and an upper contact film 67 is deposited on the upper surface of gate dielectric layer 63. An etch-stop layer 68 is provided on the upper surface of active layer 64 and defines the channel area in active layer 64. Source/drain metal contacts 69 are deposited on either side of etch-stop layer 68 to complete MOTFT 60.

In the preferred embodiment underlying conduction film 65 includes a high mobility semiconductor metal oxide including high concentrations of indium, such as $In_2O_3$, InZnO, and the like. Underlying conduction film 65 may be for example approximately 200 nm thick. Also, in this specific example middle passivation film 66 is a much more stable and lower mobility metal oxide material. Middle passivation film 65 may be for example $ZnO_2$ or the like. Upper contact film 67 is very thin and may be for example a few monolayers (1-5 monolayers) of metal or metal oxide to provide a good ohmic contact.

In this example, the etch-stop material in layer 68 is an oxygen donating material which can render the thin contact film 67 nonconducting, i.e. the metal is modified to a metal oxide. In contact areas where the source/drain metal 69 covers contact film 67 there is no oxygen donating etch-stop and the top contact layer 67 remains conductive to facilitate ohmic contact. During an annealing process after processing etch-stop layer 68 or after processing source/drain contacts 69, the extra oxygen from etch-stop layer 68 reacts with the metal of thin contact layer 67 and converts it into a high oxygen content, low conductive layer in the channel area. A series of organic and inorganic etch-stop materials with oxygen donating function have been disclosed in copending U.S. patent application entitled "METAL OXIDE TFT WITH IMPROVED SOURCE/DRAIN CONTACTS", Ser. No. 12/155,749 (4674-A23) included herein by reference. Examples of photopatternable organic etch-stop with oxygen donating function include PMMA, polyimide, and PMGi. More generally, the organic compounds comprising alcohols (R—OH), eithers (R—O—R), ketones (R—CO—R), aldehydes (R—CO—H), carboxylic acids (R—COOH), esters (R-coo-R), acid anhydrides (R—Co—O—C—R), and amides (R—C(O)—NR) may be used. In the expressions above "R" represents an organic group. Epoxides also fall into this category, they are a special type of ethers in which the oxygen atom is part of a ring of three atoms.

In addition to InAlZnO, metal oxide passivation layer 66 can also be made by blending (or alloying) InZnO with a metyal oxide having "amphiprotic" properties: which means the corresponding metal and the metal oxide react with a strong base, such as KOH or NaOH, and has a substantially faster etching rate than $In_2O_3$ and $ZnO_2$. Examples of such metal oxides include B—O, Y—O. Moreover, In-x-Zn—O with x in the $3^{rd}$ or $4^{th}$ column of the periodic table (such as B, Si, Ge) can also be used for the passivation layer and can be etched with KOH or NaOH.

Figure 7:
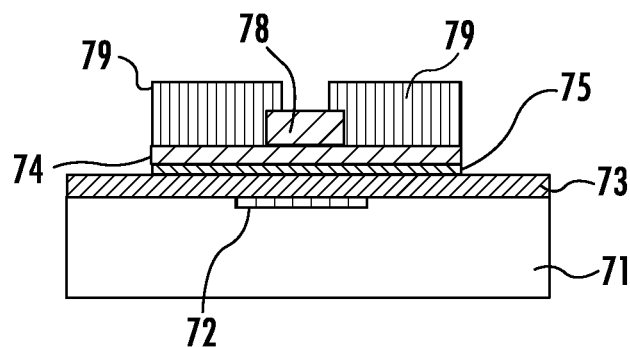
FIG. 7 is a simplified layer diagram of an example of another MOTFT with improved operational stability and high mobility, in accordance with the present invention.

Turning now to FIG. 7, another example is illustrated of a MOTFT 70 with improved operational stability and high mobility, in accordance with the present invention. MOTFT 70 includes a substrate 71 with a bottom gate 72 patterned in the upper surface. A gate dielectric layer 73 is deposited over gate 72 and portions of the upper surface of substrate 71 not covered by gate 72. It has been identified that positive bias stress instability is caused by oxygen movement from the gate dielectric interface to the conduction channel leading to a positive shift of threshold voltage. An example of this positive shift is illustrated in FIG. 2 by curve 27.

In the example of a MOTFT with improved operational stability and high mobility of FIG. 7, to prevent the movement of oxygen from gate dielectric 73, MOTFT 70 includes a very thin film of oxygen bonding metal, designated 75, positioned at the interface with an active layer 74. Thin film 75 is, for convenience and, as explained below, can be deposited in situ with the other films included in active layer 74, considered a portion of active layer 74. An etch-stop layer 78 is provided on the upper surface of active layer 74 and defines the channel area in active layer 74. Source/drain metal contacts 79 are deposited on either side of etch-stop layer 78 to complete MOTFT 70. Metal film 75 is deposited with a thickness on the order of a single molecular layer to a few (i.e. less than 5) molecular layers and includes metals chosen so that they have a stable oxide, such as Al, Si, B, Ta, Mg, Ti, and the like. Other metals with metal-oxygen bond strength larger than 100 kcal/mol can also be used. Generally, the metal tightly bonding the oxygen forms a metal oxide that is electrically nonconductive so that only active layer 74 conducts current between source/drain contacts 79.

Excess oxygen at the interface of metal film 75 with gate dielectric 73 is then tightly bound by metal atoms in metal film 75 and forms a stable metal oxide bond which eliminates the extra oxygen atoms and other impurity ions and prevents them from moving into the channel or active layer 74. Thus, the threshold voltage for MOTFT 70 is stabilized under high positive biasing fields. By properly tuning the thickness of metal film 75, and therefore the number of metal atoms, the extra oxygen and other cat ions at gate dielectric 73 can be balanced.

In a specific example of the above improved operational stability and high mobility MOTFT, a thin Ti layer was deposited by DC sputtering process in the same chamber used for the following channel layers. The nominal thickness of the Ti layer was 1.2 nm. With an InZnO (In:Zn ratio=1:1) channel layer of 20 nm and a passivation layer made of InAlZnP (In:Al:Zn ratio of 1:1:1), a high mobility TFT was achieved with negligible $V_{th}$ shift in both a forward bias field of +20 mV/cm and a negative bias field of −20 mV/cm at 60° C.

It should be noted that the MOTFT structures disclosed above can be achieved without additional tools. For example, after completing the gate layer process and gate dielectric deposition (such as $SiO_2$, SiN, $Al_2O_3$, or HfO), the substrate (either glass, plastic, or stainless steel sheet) can be loaded into a sputter tool with multiple chambers or a chain type sputter tool with multiple target positions. The thin film of oxygen bonding metal and the multiple films of the active layer can all be deposited in one pumping down (i.e. in situ) without a vacuum break. The multiple layers can be processed in different chambers or at different target positions in the same chamber. As an alternative process, the thin film of oxygen bonding metal can be achieved by means of a coating process with a solution comprising organo-metallic molecules comprising the corresponding metal. The thin film of oxygen bonding metal can alternatively be achieved by a reduction process in a chamber with inert gas or in a vacuum. In this approach, one sputter source and power supply in the sputter tool can be saved.

The present invention provides a new and improved MOTFT with improved operational stability and high mobility and new and improved methods of fabricating MOTFTs with improved operational stability and high mobility. Also, the present invention provides new and improved methods and apparatus for reducing the $V_{th}$ shift under negative and positive bias temperature stress in a MOTFT.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A method of fabricating a stable, high mobility metal oxide thin film transistor comprising the steps of:
    providing a substrate;
    positioning a gate on an upper surface of the substrate;
    depositing a gate dielectric layer on the gate and portions of the substrate not covered by the gate;
    forming a multiple film active layer on the gate dielectric layer, the multiple film active layer including a metal oxide semiconductor film and a metal oxide passivation film with the metal oxide passivation film being positioned in overlying relationship to the metal oxide semiconductor film, the metal oxide passivation film having an upper surface and including AlZnO, and the metal oxide semiconductor film including metal oxide semiconductor other than AlZnO;
    depositing an etch-stop layer on the upper surface of the metal oxide passivation film of the multiple film active layer, the etch-stop layer defining a channel area in the multiple film active layer;
    modifying a portion of the upper surface of the metal oxide passivation film of the multiple film active layer on opposite sides of the etch-stop layer including exposing the upper surface of the metal oxide passivation film to a basic material to remove the aluminum in the metal oxide passivation film adjacent the upper surface; and
    positioning metal source/drain contacts on the modified portion of the upper surface of the metal oxide passivation film of the multiple film active layer.

2. A method as claimed in claim 1 wherein the step of modifying a portion of the multiple film active layer includes altering the conductivity of at least the upper surface of the metal oxide passivation film in contact with the metal source/drain contacts to form an ohmic contact between the metal oxide passivation film and the metal source/drain contacts.

3. A method as claimed in claim 2 wherein the step of depositing an etch-stop layer includes a photolithographic patterning process including the use of the basic material and the step of altering the conductivity includes exposing a surface of the metal oxide passivation film on opposite sides of the etch-stop layer to the basic material.

4. In a metal oxide thin film transistor including a substrate, a gate positioned on the substrate, a gate dielectric layer positioned on the gate and portions of the substrate not covered by the gate, an active layer positioned on the gate dielectric layer, and an etch-stop layer positioned on the active layer so as to define a channel area in the active layer, a method of fabricating a stable, high mobility active layer comprising the steps of:
    forming the active layer with a plurality of films including a metal oxide semiconductor film and a metal oxide passivation film, the metal oxide passivation film having a major upper surface and including aluminum;
    positioning the metal oxide passivation film between the metal oxide semiconductor film and the etch-stop layer;
    modifying a portion of the major upper surface of the metal oxide passivation film including treating the aluminum with a base material to remove the aluminum from the portion of the major upper surface of the metal oxide passivation film to increase the conductivity, the base material being other than gas-phase ammonia; and
    positioning metal source/drain contacts on the modified portion of the major upper surface of the metal oxide passivation film.

5. A method as claimed in claim 4 wherein the step of forming the active layer includes forming the metal oxide semiconductor film with a higher mobility and lower stability than the metal oxide passivation film.

6. A method as claimed in claim 4 further including a step of modifying at least the major upper surface of the metal oxide passivation film in contact with the metal source/drain contacts, prior to positioning the metal source/drain contacts on the major upper surface of the metal oxide passivation film, to form an ohmic contact between the metal oxide passivation film and the metal source/drain contacts.

* * * * *